(12) United States Patent
Maeda et al.

(10) Patent No.: US 6,433,285 B2
(45) Date of Patent: Aug. 13, 2002

(54) PRINTED WIRING BOARD, IC CARD MODULE USING THE SAME, AND METHOD FOR PRODUCING IC CARD MODULE

(75) Inventors: Kenji Maeda, Osaka; Takashi Takata, Shiga; Hiroki Naraoka, Osaka; Hajime Homma, Osaka; Shigeru Nonoyama, Osaka; Yoshiyuki Arai; Yuichiro Yamada, both of Kyoto; Fumito Ito, Osaka, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/735,792

(22) Filed: Dec. 14, 2000

(30) Foreign Application Priority Data

Mar. 30, 2000 (JP) ........................................ 2000-093188

(51) Int. Cl.⁷ ................................................. H05K 1/16
(52) U.S. Cl. ........................ 174/260; 174/255; 174/256; 257/778; 264/272.17; 361/752
(58) Field of Search ................................. 174/260, 258, 174/261, 256, 255; 264/263, 272.17, 275; 257/778, 782; 235/486; 361/737, 752, 750

(56) References Cited

U.S. PATENT DOCUMENTS

| | | | | |
|---|---|---|---|---|
| 5,498,388 A | * | 3/1996 | Kodai et al. | 264/275 |
| 5,612,532 A | * | 3/1997 | Iwasaki | 235/486 |
| 5,814,890 A | * | 9/1998 | Iwasaki | 257/778 |
| 5,866,950 A | * | 2/1999 | Iwasaki et al. | 257/782 |

* cited by examiner

*Primary Examiner*—Albert W. Paladini
(74) *Attorney, Agent, or Firm*—Nixon Peabody LLP; Donald R. Studebaker

(57) ABSTRACT

The present invention provides a printed wiring board, an IC card module including the printed wiring board, and a method for fabricating the IC card module, for improving reliability of IC cards. The printed wiring board and the IC card module of the invention include: a base having a resin sealing region, clamped regions in a periphery zone of the resin sealing region clamped with a sealing mold, and non-clamped regions in the periphery zone; and terminals for external connection formed on the top surface of the base. The terminals are formed in a region other than any of the resin sealing region, the clamped regions, and the non-claimed regions.

15 Claims, 12 Drawing Sheets

PRINTED WIRING BOARD, IC CARD MODULE USING THE SAME, AND METHOD FOR PRODUCING IC CARD MODULE

BACKGROUND OF THE INVENTION

The present invention relates to a printed wiring board and a module for an IC card using the printed wiring board, and more particularly, relates to improvement in reliability of IC cards.

In recent years, for reduction in the size of IC cards and the number of components of an IC card, improvement in flexural strength, cost reduction, and other purposes, a module for an IC card having the following structure has been proposed. A semiconductor device is directly mounted on a printed wiring board of the module and sealed with a resin.

A conventional IC card module will be described with reference to FIGS. 12(a) and 12(b). FIG. 12(a) is a top view of the conventional IC card module, and FIG. 12(b) is a cross-sectional view taken along line X—X in FIG. 12(a).

A conventional IC card module 110 includes: a substrate 111; a semiconductor device 113 mounted on the substrate 111; terminals 118 formed in the bottom portion of the substrate 111; connection holes (not shown) extending through the substrate 111 to reach the terminals 118; connection lands (not shown) formed on the substrate 111 and connected with the terminals 118 via the connection holes; wires 114 for connecting the connection lands and the semiconductor device 113; and a resin 116 for sealing the semiconductor device 113. The wires 114 are conductive wires made of metal such as gold and aluminum.

The resin 116 sealing the semiconductor device 113 is formed by transfer molding, potting, or printing using a thermosetting resin, or injection molding using a thermoplastic resin.

The IC card module 110 is fitted in a case or the like with the terminals 118 exposed outside, to complete an IC card.

In the conventional IC card module 110, the terminals 118 are located opposite to the semiconductor device 113 with respect to the substrate 111. Therefore, when the IC card is to be connected with an external apparatus provided with an IC card slot, for example, the semiconductor device 113 must be inserted into the slot along with the terminals 118. Therefore, the semiconductor device 113 may possibly be adversely influenced by external mechanical stress, heat from the external apparatus, and the like.

SUMMARY OF THE INVENTION

An object of the present invention is to provide a printed wiring board and an IC card module using the printed wiring board that can contribute to improvement in reliability of IC cards.

The IC card module of the present invention includes: a base having a resin sealing region, clamped regions in a periphery zone of the resin sealing region clamped with a sealing mold, and non-clamped regions in the periphery zone of the resin sealing region that are not clamped; a semiconductor device mounted on a top surface of the base; terminals for external connection formed on the top surface of the base; wiring formed on the top surface of the base for connecting the semiconductor device and the terminals; and a resin for sealing the semiconductor device, wherein the terminals are formed in a region other than any of the resin sealing region, the clamped regions, and the non-clamped regions.

The semiconductor device is located at a position apart from the terminals on the base. With this construction, when an IC card fabricated using the IC card module of the invention is to be connected with an external apparatus provided with an IC card slot, the terminals can be inserted into the slot for the connection without placing the semiconductor device inside the slot. This makes it possible to fabricate an IC card having a structure that protects the semiconductor device from being adversely influenced by external mechanical stress, heat from the external apparatus, and the like. That is to say, an IC card with high reliability is obtained.

Preferably, the wiring is formed along routes passing through the non-clamped regions on the top surface of the base.

With the above construction, the wiring is suppressed/prevented from damage due to the clamping with the sealing mold. The resultant IC card module has reduced disconnections and short circuits. In addition, since the wiring is arranged so as to avoid clamping with the sealing mold, the following advantage is obtained in the case of forming a solder resist on the printed wiring board. The surface of the solder resist is waved when it is formed over the wiring. In the region clamped with the sealing mold, however, the solder resist is not waved since no wiring exists in this region. Thus, the resultant IC card module is free from resin leak and has resin sealing with high precision.

The non-clamped regions on the top surface of the base may correspond to a resin injection gate and an air vent of the sealing mold.

Preferably, at least one layer of inner wiring and then an insulating layer are formed on the top surface of the base, the semiconductor device is formed on the insulating layer, and portions of the wiring located in the periphery zone constitute the inner wiring.

With the above construction, the wiring as the inner wiring is sandwiched by and thus mechanically protected by the base and the insulating layer. Specifically, if the IC card module is bent with an external force, the portion that is not sealed with the resin warps, possibly causing damage to the wiring. The inner wiring can reduce such damage due to warping.

A solid pattern is preferably formed on portions of the periphery zone that do not have the wiring.

The above construction can reduce warping in the periphery zone of the resin sealing region, and thus further reduce damage to the wiring and the base.

The top surface of the solid pattern is preferably at a height equal to or greater than the height of a top surface of the wiring.

The above construction prevents the wiring from being clamped with the sealing mold in the periphery zone of the resin sealing region. Therefore, damage to the wiring during the clamping is prevented.

The solid pattern preferably functions as power source wiring or grounding wiring. This stabilizes the voltage from the power supply.

Preferably, the IC card module further includes a semiconductor device formed on a back surface of the base, wiring for connecting the semiconductor device formed on the back surface and the terminals, and a resin for sealing the semiconductor device formed on the back surface.

The above double-sided structure allows for increase in the number of semiconductor devices that can be mounted on the printed wiring board, or decrease in the volume occupied by a semiconductor device when implemented. That is, it is possible to obtain an IC card module with semiconductor devices mounted at a high density.

The printed wiring board of the present invention includes: a base having a resin sealing region, clamped regions in a periphery zone of the resin sealing region clamped with a sealing mold, and non-clamped regions in the periphery zone of the resin sealing region that are not clamped; connection lands formed on the top surface of the base for connection with a semiconductor device; terminals for external connection formed on the top surface of the base; and wiring formed on the top surface of the base for connecting the connection lands and the terminals, wherein the terminals are formed in a region other than any of the resin sealing region, the clamped regions, and the non-clamped regions, and the wiring is formed along routes passing through the non-clamped regions on the top surface of the base.

The above construction suppresses/prevents the wiring from being damaged due to the clamping with the sealing mold. Therefore, an IC card module using the printed wiring board with this construction has reduced disconnections and short circuits. In addition, since the wiring is arranged so as to avoid clamping with the sealing mold, the following advantage is obtained in the case of forming a solder resist on the printed wiring board. In the region clamped with the sealing mold, the solder resist is not waved since no wiring exists in this region. An IC card module using such a printed wiring board is free from resin leak and has resin sealing with high precision.

The non-clamped regions on the top surface of the base may correspond to a resin injection gate and an air vent of the sealing mold.

A solid pattern is preferably formed on portions of the periphery zone that do not have the wiring.

The above construction can reduce warping in the periphery zone of the resin sealing region, and thus further reduce damage to the wiring and the base.

The top surface of the solid pattern is preferably at a height equal to or greater than the height of a top surface of the wiring.

The above construction prevents the wiring from being clamped with the sealing mold in the periphery zone of the resin sealing region. Therefore, damage to the wiring during the clamping is prevented.

Preferably, at least one layer of inner wiring and then an insulating layer are formed on the top surface of the base, the semiconductor device is formed on the insulating layer, and portions of the wiring located in the periphery zone constitute the inner wiring.

With the above construction, the wiring as the inner wiring is sandwiched by and thus mechanically protected by the base and the insulating layer. Specifically, if the printed wiring board is bent with an external force, the portion that is not sealed with the resin warps, possibly causing damage to the wiring. The inner wiring can reduce such damage due to warping.

The method for fabricating an IC card module of the present invention includes the steps of: (a) preparing a printed wiring board comprising: a base having a resin sealing region, clamped regions in a periphery zone of the resin sealing region clamped with a sealing mold, and non-clamped regions in the periphery zone of the resin sealing region that are not clamped; connection lands formed on the top surface of the base for connection with a semiconductor device; terminals for external connection formed on the top surface of the base; and wiring formed on the top surface of the base for connecting the connection lands and the terminals, wherein the terminals are formed in a region other than any of the resin sealing region, the clamped regions, and the non-clamped regions, and the wiring is formed along routes passing through the non-clamped regions on the top surface of the base; (b) mounting the semiconductor device in the resin sealing region by securing the semiconductor device to the base; (c) connecting the semiconductor device and the connection lands by means of conductive members; and (d) clamping the printed wiring board with a sealing mold to seal the semiconductor device with a resin.

By the above method, damage to the wiring due to the clamping with the mold is suppressed/prevented. This makes it possible to obtain an IC card module with reduced disconnections and short circuits.

In the step (a) of preparing a printed wiring board, the non-clamped regions on the top surface of the base may correspond to a resin injection gate and an air vent of the sealing mold.

DESCRIPTION OF THE PREFERRED EMBODIMENTS

Figure 1A:
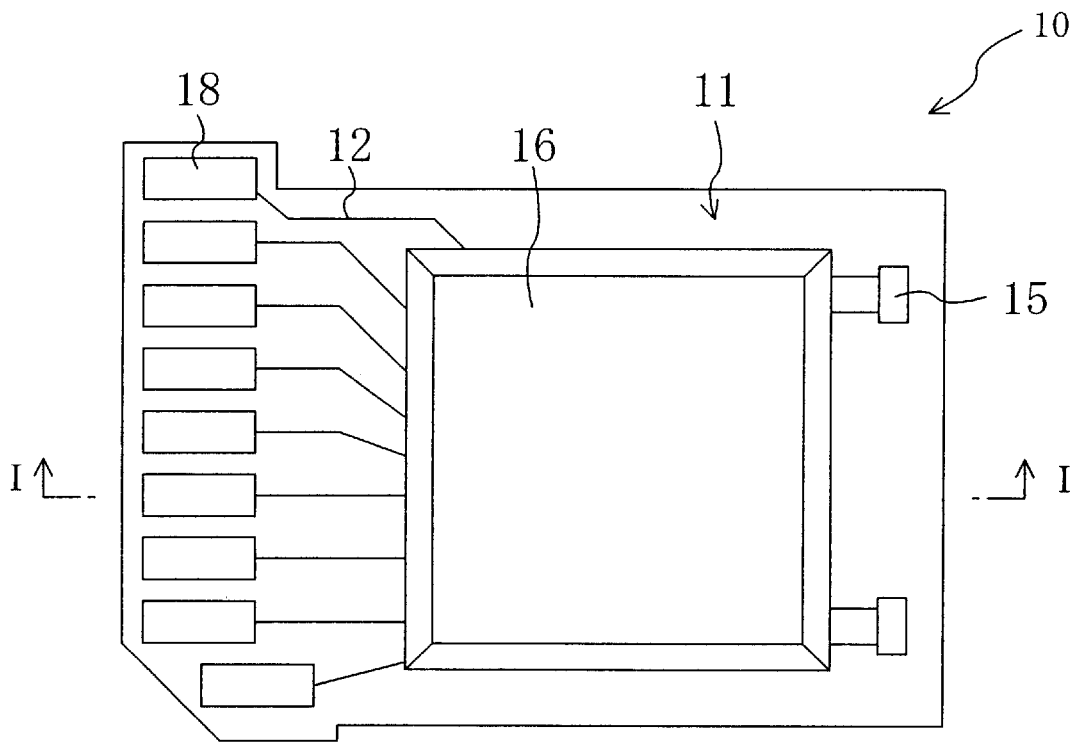
FIG. 1(a) is a top view of an IC card module of EMBODIMENT 1 of the present invention.

Hereinafter, preferred embodiments of the present invention will be described with reference to the accompanying drawings. For simplification, common components through the embodiments are denoted by the same reference numerals.

Embodiment 1

Figure 1B:
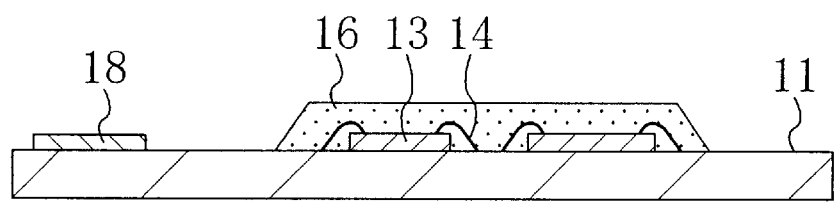
FIG. 1(b) is a cross-sectional view taken along line I—I in FIG. 1(a).
Figure 2:
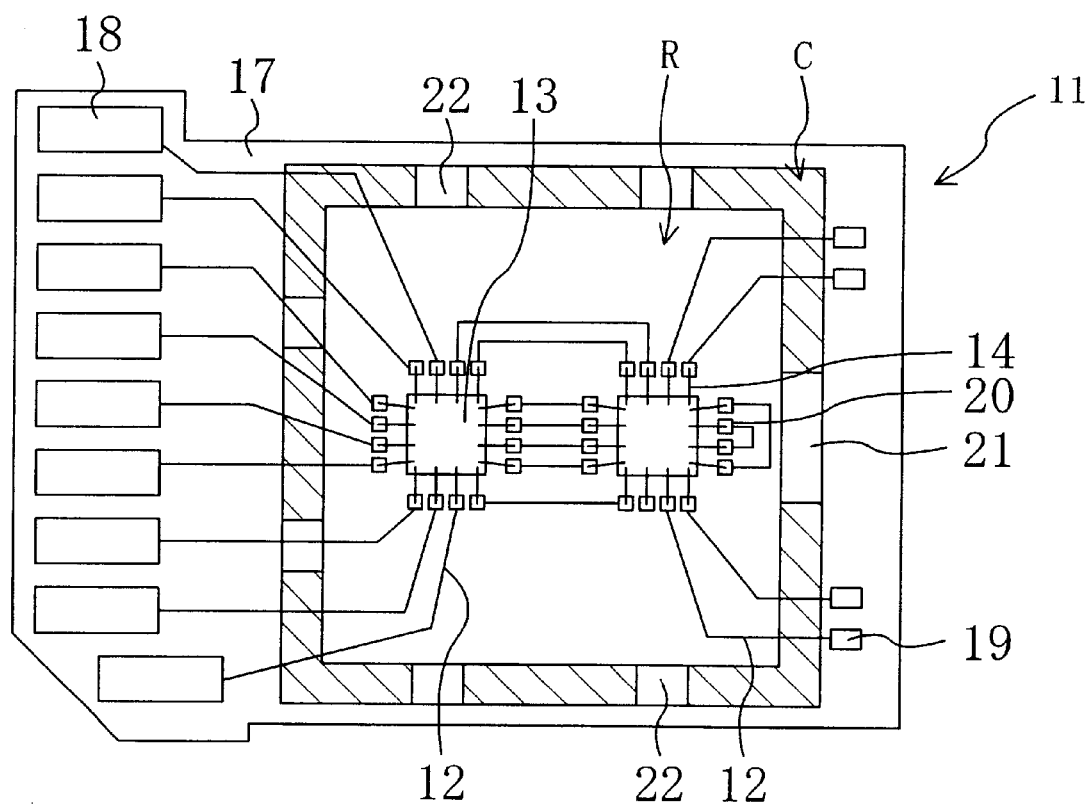
FIG. 2 is a top view of a printed wiring board used for the IC card module of EMBODIMENT 1.
Figure 3A:
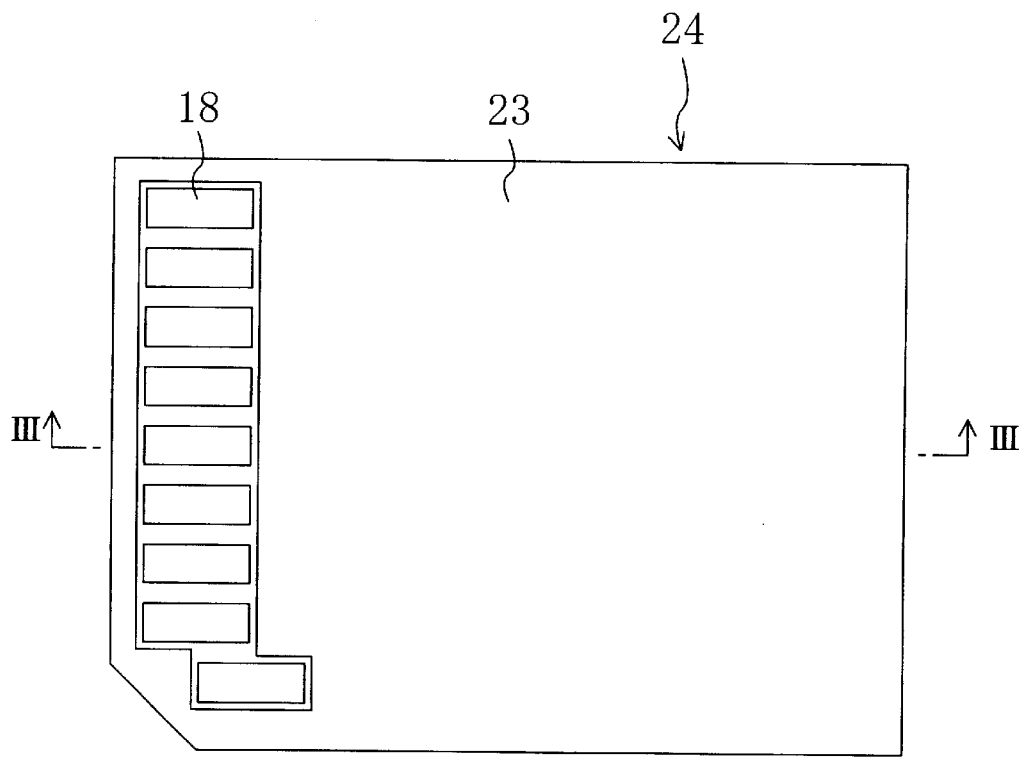
FIG. 3(a) is a top view of an IC card including the IC card module of EMBODIMENT 1.
Figure 3B:
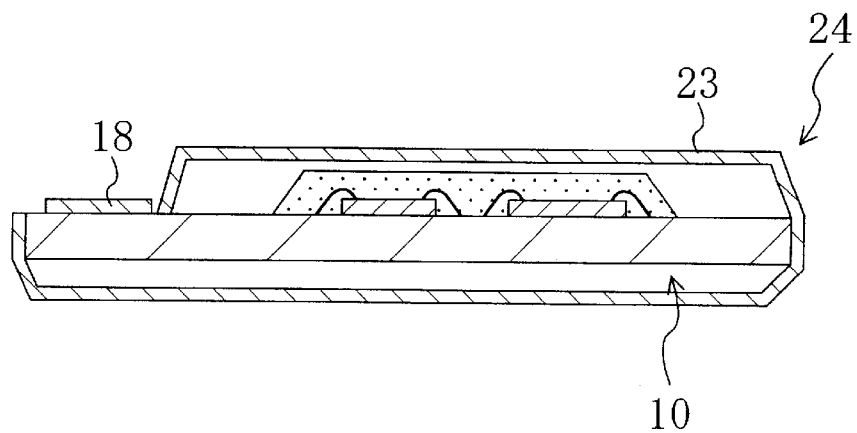
FIG. 3(b) is a cross-sectional view taken along line III—III in FIG. 3(a).

An IC card module 10 of EMBODIMENT 1 of the present invention will be described with reference FIGS. 1(a), 1(b), 2, 3(a), and 3(b). FIG. 1(a) is a top view of the IC card module 10 of this embodiment, and FIG. 1(b) is a cross-sectional view taken along line I—I in FIG. 1(a). FIG. 2 is a top view of a printed wiring board 11 used for the IC card module 10 of this embodiment. FIG. 3(a) is a top view of an IC card including the IC card module 10 of this embodiment, and FIG. 3(b) is a cross-sectional view taken along line III—III in FIG. 3(a).

Referring to FIGS. 1(a) and 1(b), the IC card module 10 of this embodiment includes: the printed wiring board 11 having wiring 12 printed on the top surface; semiconductor devices 13 mounted on the printed wiring board 11; wires 14 connecting the wiring 12 and the semiconductor devices 13; chip components 15 such as resistors and capacitors; and a resin 16 sealing the semiconductor devices 13 and the wires 14. The semiconductor devices 13, the wires 14, the chip components 15, and the resin 16 are all formed on the surface of the printed wiring board 11 on which the wiring 12 is printed.

The structure of the printed wiring board 11 will be described.

Referring to FIG. 2, the printed wiring board 11 used for the IC card module 10 includes: a base 17 made of an insulating material such as a resin; the wiring 12 printed on the base 17; terminals 18 formed on an end portion of the top surface of the base 17; lands 19 for implementing the chip components 15 such as resistors and capacitors on the base 17; and connection lands 20 arranged to surround the semiconductor devices 13 to be mounted. In the printed wiring board 11 of this embodiment, the terminals 18, the lands 19, and the connection lands 20 are all formed on the surface of the printed wiring board 11 on which the wiring 12 is printed, and are connected to each other by means of the printed wiring 12 made of a conductive material (for example, copper).

The terminals 18 and the lands 19 are located outside a periphery zone composed of clamped regions C to be clamped with the sealing mold, a resin injection gate region 21, and air vent regions 22 on the base 17. The lands 19 may be provided as required. The positions of the lands 19 to be placed are not limited.

The connection lands 20 are formed in a region R sealed with the resin at positions supposed to surround the semiconductor devices 13.

The method for fabricating the IC card module 10 will be described.

First, the printed wiring board 11 is prepared by forming the terminals 18, the lands 19, and the connection lands 20 on the top surface of the base 17 and printing the wiring 12 on the top surface of the base 17 so as to connect the terminals 18, the lands 19, and the connection lands 20 with each other. In this embodiment, a solder resist (not shown) covers the entire top surface of the printed wiring board 11 except for the terminals 18, the lands 19, and the connection lands 20. The solder resist may be provided as required. It is not particularly required.

Next, the semiconductor devices 13 are mounted in the resin sealing region R by being secured to the base 17 with an adhesive or the like.

The semiconductor devices 13 are then connected with the connection lands 20 by wire bonding using the wires 14.

In this embodiment, wire bonding is employed to mount the semiconductor devices 13 on the printed wiring board 11. Alternatively, another known method such as ball grid array (BGA) may be used.

The semiconductor devices 13 mounted on the printed wiring board 11 are then sealed with the resin 16. In this embodiment, transfer molding using a thermosetting resin is employed, but another known molding method (for example, potting, printing, or injection molding using a thermoplastic resin) may be employed for resin sealing. Employing transfer molding or injection molding, in particular, the resin can be molded into a small-size cured resin product, and thus resin sealing with high precision is possible.

In the transfer molding, a thermosetting resin (for example, epoxy resin) is used as the sealing resin, and the sealing mold has a resin injection gate and air vents. In the sealing process, the printed wiring board is firmly clamped with the sealing mold, and then the inside of the sealing mold is filled with the thermosetting resin. The resin is injected inside the sealing mold through the resin injection gate that corresponds to the resin injection gate region 21 on the base 17 shown in FIG. 2. Simultaneously, air inside the sealing mold is exhausted from the air vents that correspond to the air vent regions 22 on the base 17 shown in FIG. 2. Upon completion of the filling with the resin, the sealing mold is heated to about 180° C. to cure the resin and thus seal the semiconductor devices 13.

The resultant IC card module 10 is fit into a case 23 with the terminals 18 exposed outside. Thus, an IC card 24 shown in FIGS. 3(a) and 3(b) are obtained. The case 23 is made of plastic or metal. Alternatively, a card-like thin plate made of plastic or metal having a concave portion may be used. The IC card module 10 may be buried in the concave portion to obtain an IC card.

As described above, the IC card module 10 of this embodiment has the semiconductor devices 13 and the terminals 19 formed at positions on the base 17 apart from each other. Therefore, when the IC card 24 fabricated in the above manner using the IC card module 10 is to be connected with an external apparatus provided with an IC card slot, the terminals 18 of the IC card 24 can be inserted into the slot for connection without placing the semiconductor devices 13 inside the slot. That is to say, the resultant IC card 24 has a structure that protects the semiconductor devices 13 from being adversely influenced by external mechanical stress, heat from the external apparatus, and the like. In this embodiment, therefore, a highly reliable IC card is obtained.

Embodiment 2

Figure 4:
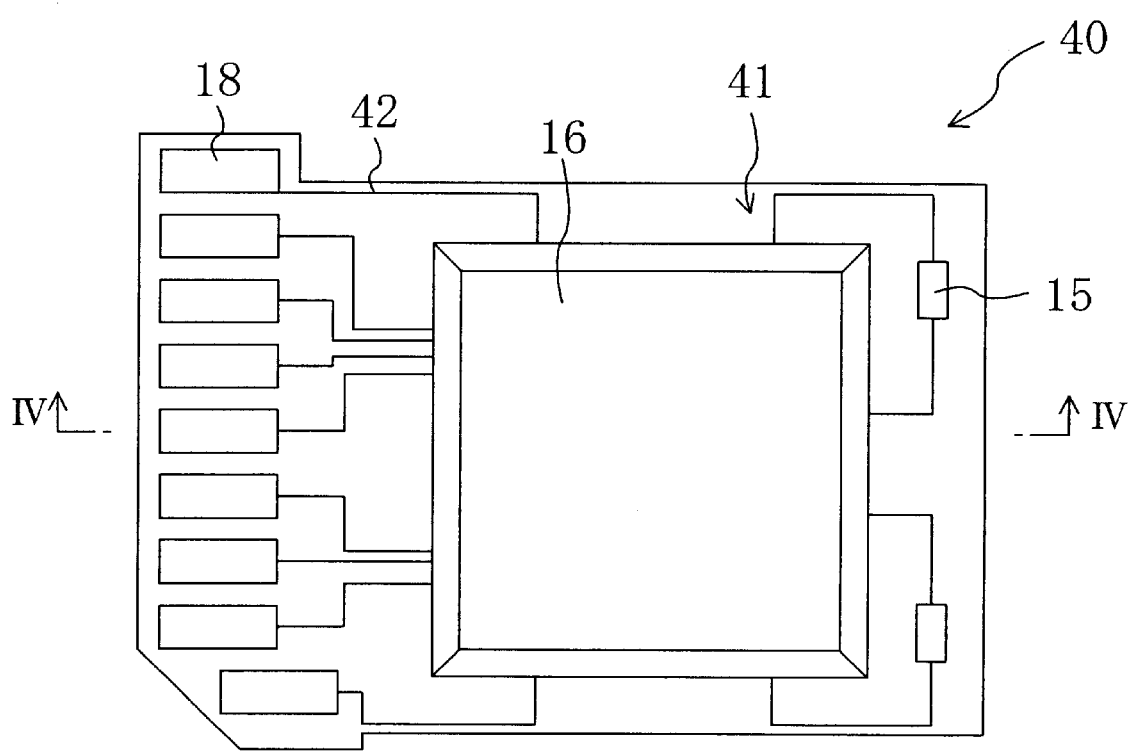
FIG. 4 is a top view of an IC card module of EMBODIMENT 2 of the present invention

An IC card module 40 of EMBODIMENT 2 of the present invention will be described with reference FIGS. 4, 5, and 6. FIG. 4 is a top view of the IC card module 40 of this embodiment, FIG. 5 is a top view of a printed wiring board 41 used for the IC card module 40 of this embodiment, and FIG. 6 is a partial cross-sectional view illustrating a state during clamping with a sealing mold in a resin sealing process in the fabrication of the IC card module 40 using the printed wiring board 41.

Referring to FIG. 4, the components of the IC card module 40 of this embodiment are the same as those of the IC card module 10 of EMBODIMENT 1. The cross section taken along line IV—IV in FIG. 4 is the same as that of the IC card module 10 (see FIG. 1(b)). The difference is the pattern of wiring 42 printed on the printed wiring board 41.

The pattern of the wiring 42 printed on the printed wiring board 41 of this embodiment will be described with reference to FIG. 5.

Figure 5:
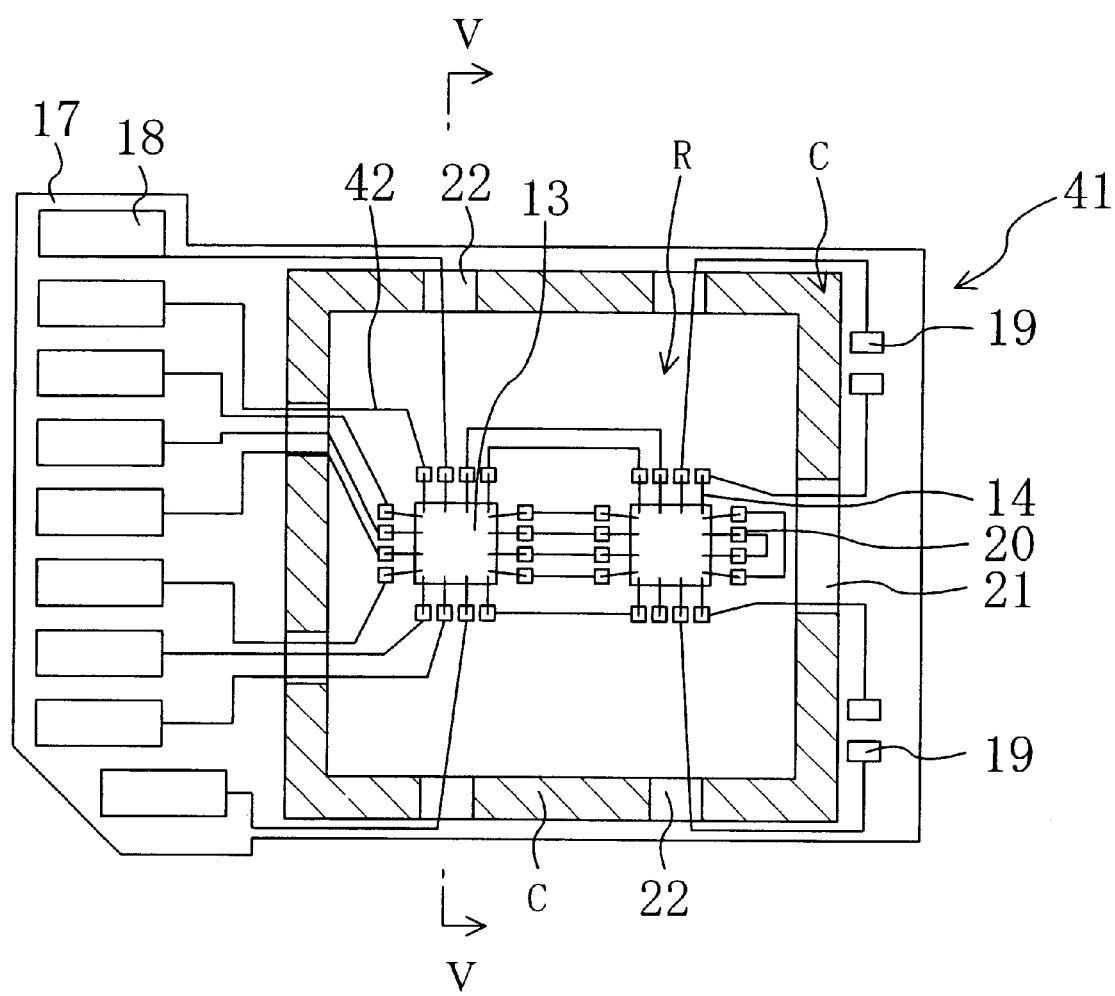
FIG. 5 is a top view of a printed wiring board used for the IC card module of EMBODIMENT 2.
Figure 6:
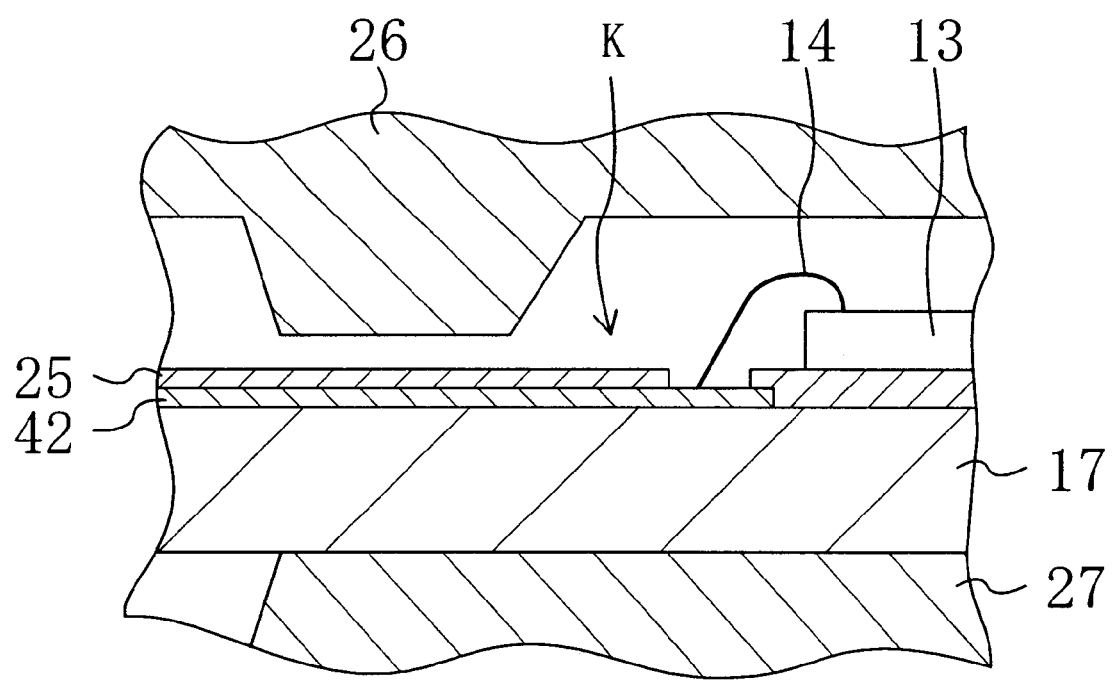
FIG. 6 is a partial cross-sectional view illustrating a state during clamping with a sealing mold in a resin sealing process in the fabrication of an IC card module using a printed wiring board.

Referring to FIG. 5, as the printed wiring board 11 of EMBODIMENT 1, the printed wiring board 41 used for the IC card module 40 includes: a base 17 made of an insulating material such as a resin, the wiring 42 printed on the base 17; terminals 18 provided on an end portion of the top surface of the base 17; lands 19 for implementing chip components 15 such as resistors and capacitors on the base 17; and connection lands 20 arranged to surround the semiconductor devices 13 to be mounted. In the printed wiring board 41 of this embodiment, the terminals 18, the lands 19, and the connection lands 20 are all formed on the surface of the printed wiring board 41 on which the wiring 42 is printed. The wiring 42 is printed on the base 17 so as to extend along routes passing through a resin injection gate region 21 and air vent regions 22 that are not clamped with a sealing mold.

The terminals 18 and the lands 19 are located outside a periphery zone composed of clamped regions C to be clamped with the sealing mold, the resin injection gate region 21, and the air vent regions 22 on the base 17. The connection lands 20 are located in a region R sealed with the resin at positions supposed to surround the semiconductor devices 13. The terminals 18, the lands 19, and the connection lands 20 are connected to each other with the printed wiring 42 made of a conductive material (for example, copper).

The method for fabricating the IC card module 40 of this embodiment will be described. The fabrication method is the same as that for the IC card module 10 of EMBODIMENT 1 until the process of mounting the semiconductor devices 13 on the printed wiring board 41. Therefore, description of this embodiment focuses on the resin sealing process after the process of mounting the semiconductor devices 13 and the subsequent processes.

FIG. 6 is a partial cross-sectional view illustrating a state during clamping with a sealing mold in the resin sealing process in the fabrication of the IC card module 40 using the printed wiring board 41. This cross section corresponds to the cross section taken along line V-V across the printed wiring board 41 in FIG. 5.

Referring to FIG. 6, the semiconductor devices 13 are secured to the base 17 of the printed wiring board 41 with an adhesive or the like, and connected with the connection lands 20 via the wires 14 for bonding. The terminals 18 and the lands 19 are located outside a periphery zone composed of the clamped region C to be clamped with the sealing mold, the resin injection gate region 21, and the air vent regions 22. The wiring 42 electrically connects the semiconductor devices 13 with the terminals 18 or the chip components 15 mounted on the lands 19. The wiring 42 and a solder resist 25 extend from the resin sealing region R beyond the resin injection gate region 21 and the air vent regions 22. The solder resist 25 may be provided as required. It is not particularly required.

In the sealing process, the regions C are clamped with an upper mold 26 and a lower mold 27 of the sealing mold, and a molten resin is injected with pressure into a cavity k formed by the upper and lower molds 26 and 27 through a resin injection gate corresponding to the resin injection gate region 21. At this time, air in the cavity k is exhausted through air vents corresponding to the air vent regions 22.

In EMBODIMENT 1, the wiring 12 extends in the regions C clamped with the sealing mold on the base 17. In the printed wiring board 41 of this embodiment, the wiring 42 extends along routes passing through the resin injection gate region 21 and the air vent regions 22 on the base 17 so that the wiring 42 is prevented from being clamped. Therefore, as shown in FIG. 6, the upper mold 26 is kept away from the wiring 42 in the resin sealing process. This structure provides an effect of suppressing/preventing the wiring 42 from being damaged due to the clamping with the sealing mold, in addition to the effect obtained in EMBODIMENT 1. Thus, the resultant IC card module 40 advantageously has reduced disconnections and short circuits.

In this embodiment, all the interconnections of the wiring 42 are arranged to pass through the resin injection gate region 21 and the air vent regions 22. Alternatively, only specific interconnections that have high possibility of causing disconnections and short circuits with adjacent interconnections may be arranged to pass through the resin injection gate region 21 and the air vent regions 22. In this case, also, such interconnections arranged to pass through the resin injection gate region 21 and the air vent regions 22 are suppressed/prevented from being damaged due to clamping during the resin sealing, and thus the resultant IC card module provides high reliability.

In this embodiment, high-precision resin sealing is obtained for the following reason.

In the case of providing the solder resist over the printed wiring board, the portions of the surface of the solder resist located above the interconnections are raised, forming a waved shape. If the solder resist is formed in EMBODIMENT 1, where the wiring 12 is formed in the regions C clamped with the sealing mold on the base 17, a gap may be generated between the sealing mold and the waved solder resist in the clamped regions C during clamping in the sealing process. This may possibly cause leak of the resin. On the contrary, in the case of providing the solder resist 25 on the printed wiring board 41 of this embodiment, where the wiring 42 is arranged so as to avoid clamping with the sealing mold, the surface of the solder resist 25 in the clamped regions C is not waved. Therefore, no resin leak is generated, and high-precision resin sealing is possible.

The IC card module 40 of this embodiment obtained as described above is fitted in a case or the like with the terminals 18 exposed outside, to obtain an IC card similar to the IC card 24 in EMBODIMENT 1 shown in FIGS. 3(a) and 3(b). The case is made of plastic or metal. Alternatively, a card-like thin plate made of plastic or metal having a concave portion may be used. The IC card module 40 may be buried in the concave portion to obtain an IC card.

Embodiment 3

Figure 7:
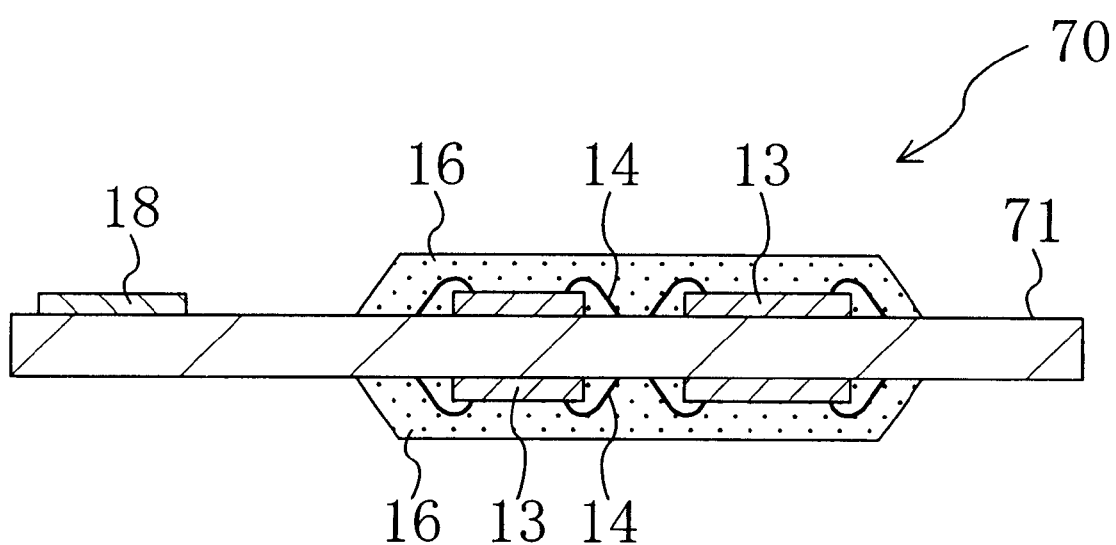
FIG. 7 is a cross-sectional view of an IC card module of EMBODIMENT 3 of the present invention.

An IC card module 70 of EMBODIMENT 3 of the present invention will be described with reference FIG. 7. FIG. 7 is a cross-sectional view of the IC card module 70 of this embodiment.

The IC card module 70 of this embodiment includes the same components as those of the IC card module 40 of EMBODIMENT 2 on the top surface of a printed wiring board 71. The IC card module 70 further includes semiconductor devices 13 on the back surface of the printed wiring board 71, constructing a double-sided structure having the semiconductor devices 13 on opposite surfaces of the printed wiring board 71. Having this double-sided structure, it is possible to increase the number of semiconductor devices that can be mounted on the printed wiring board 71, or reduce the volume occupied by a semiconductor device when the device is implemented. That is, it is possible to obtain an IC card module with semiconductor devices packed at high density.

The method for fabricating the IC card module 70 of this embodiment will be described.

First, the printed wiring board 71 is prepared by forming the terminals 18, the lands 19, and the connection lands 20 on the top surface of the base 17 and connection lands (not shown) on the back surface, and printing wiring (not shown) on the top surface of the base 17 for connecting the terminals 18 and the lands 19 with the connection lands 20 and the connection lands on the back surface. The connection lands on the back surface are connected with the wiring on the top surface via holes extending through the base 17.

Next, the semiconductor devices 13 are mounted in the resin sealing region R by being secured to the top and back surfaces of the base 17 with an adhesive.

The semiconductor devices 13 are then connected with the connection lands 20 by wire bonding using the wires 14. In this embodiment, wire bonding is employed to mount the semiconductor devices 13 on the printed wiring board 71. Alternatively, another known method such as BGA may be used.

The semiconductor devices 13 mounted on the printed wiring board 11 are then sealed with the resin 16. In this embodiment, transfer molding using a thermosetting resin is employed, but another known molding method (for example, potting, printing, or injection molding using a thermoplastic resin) may be employed for resin sealing.

The IC card module of this embodiment is advantageous over the IC card modules of EMBODIMENTS 1 and 2 shown in FIGS. 1 and 4 in that it is possible to increase the number of semiconductor devices 13 that can be mounted and thus improve the capability of the IC card. Also, by reducing the area of the base 17 of the printed wiring board 71, it is possible to produce a small-size IC card having the same capability as a larger-size IC card using a single-sided printed wiring board.

Embodiment 4

Figure 8:
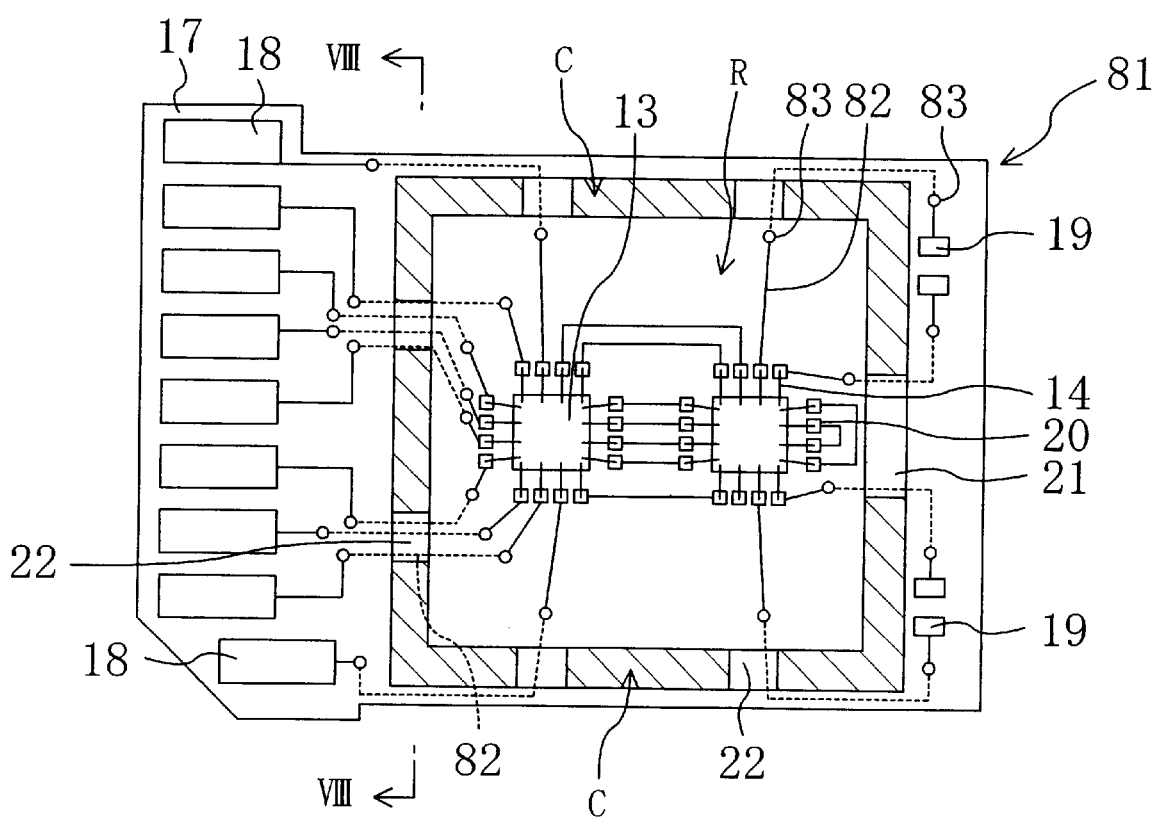
FIG. 8 is a plan view of a printed wiring board used for an IC card module of EMBODIMENT 4 of the present invention.
Figure 9:
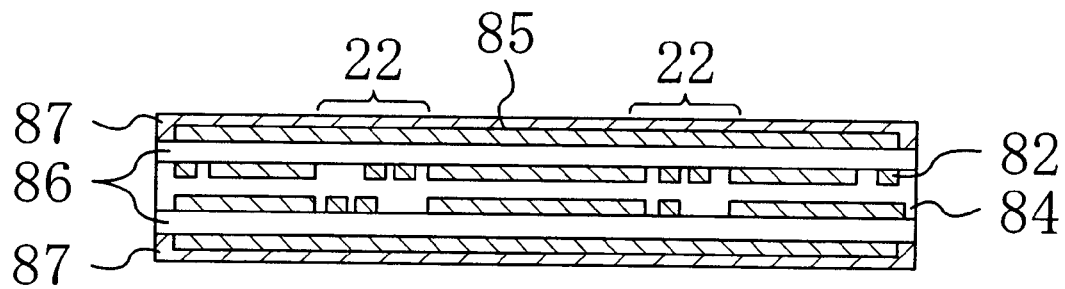
FIG. 9 is a cross-sectional view taken along line VIII—VIII in FIG. 5.

An IC card module of EMBODIMENT 4 of the present invention will be described with reference FIGS. 8 and 9. FIG. 8 is a plan view of a printed wiring board 81 used for the IC card module of this embodiment, and FIG. 9 is a cross-sectional view taken along line VIII—VIII in FIG. 8.

The components of the IC card module of this embodiment are the same as those of the IC card module 40 of EMBODIMENT 2. The difference is the pattern of wiring 82 printed on the printed wiring board 81 as shown in FIG. 5.

As the printed wiring board 41 of EMBODIMENT 2, the printed wiring board 81 of this embodiment includes: a base 17 made of an insulating material such as a resin, the wiring 82 printed on the base 17; terminals 18 provided on an end portion of the top surface of the base 17; lands 19 for implementing the chip components 15 such as resistors and capacitors on the base 17; and connection lands 20 arranged to surround semiconductor devices 13 to be mounted. In the printed wiring board 81 of this embodiment, the terminals 18, the lands 19, and the connection lands 20 are all formed on the surface of the printed wiring board 81 on which the wiring 82 is printed.

In this embodiment, the wiring 82, which electrically connects the terminals 18 and the lands 19 for the chip components 15 with the connection lands 20, is printed on the base 17 so as to extend along routes passing through a resin injection gate region 21 and air vent regions 22. In addition, the base 17 of the printed wiring board 81 has a four-layer wiring structure. Using this structure, the portions of the wiring 82 located in the resin injection gate region 21 and the air vent regions 22 are formed as inner wiring (shown by broken lines in FIG. 8). The inner wiring is connected with the other outer wiring via connection holes 83.

Referring to FIG. 9, the four-layer wiring structure includes a double-sided wiring substrate 84 having wiring patterns 82 printed on both surfaces thereof and solid patterns 85. The material of the solid patterns 85 is not specified but is preferably stiffer than that of the double-sided wiring substrate 84. In this embodiment, the solid patterns 85 are made of a metal foil and used for power supply or grounding. The double-sided wiring substrate 84 and the solid patterns 85 are bonded together with adhesive layers 86 formed by preimpregnation using the same insulating material as the double-sided wiring substrate 84. The material of the adhesive layers 86 is not specified as long as it is an insulating material. Solder resists 87 are formed on the solid patterns 85.

In the printed wiring board 81 of this embodiment, as in EMBODIMENT 2, the wiring 82 extends along routes passing through the resin injection gate region 21 and the air vent regions 22 so that the wiring 82 is prevented from being clamped with a sealing mold. Therefore, in the resin sealing, the wiring 82 is suppressed/prevented from being damaged by the clamping with the sealing mold. Thus, the resultant IC card module has reduced disconnections and short circuits.

In this embodiment, all the interconnections of the wiring 82 are arranged to pass through the resin injection gate region 21 and the air vent regions 22. Alternatively, only specific interconnections that have high possibility of disconnections and short circuits with adjacent interconnections may be arranged to pass through the resin injection gate region 21 and the air vent regions 22. In this case, also, such interconnections arranged to pass through the resin injection gate region 21 and the air vent regions 22 are suppressed/prevented from being damaged by clamping during resin sealing, and thus a highly reliable IC card module is obtained.

In this embodiment, as shown in FIGS. 8 and 9, the portions of the wiring 82 passing through the resin injection gate region 21 and the air vent regions 22 are formed as inner wiring.

In the case of EMBODIMENT 2, where the portions of the wiring 42 passing through the resin injection gate region 21 and the air vent regions 22 are formed as outer wiring, if the IC card module warps due to an external force after the resin sealing process, stress may possibly be concentrated on the portions of the wiring 42 that are not sealed with the resin since the wiring 42 and the base 17 are different in modulus of elasticity.

In the IC card module fabricated using the printed wiring board 81 in this embodiment, the inner wiring portions of the wiring 82 are vertically sandwiched by the preimpregnated adhesive layers 86 with a low modulus of elasticity. The inner wiring is therefore mechanically protected. In other words, the printed wiring board 81 of this embodiment provides the effects of, not only reducing damage during resin sealing, but also reducing damage to the wiring 82 that may be caused by warping of the unsealed region when the IC card is used.

In addition, the mechanical protecting function is enhanced by the existence of the mechanically strong solid patterns 85 sandwiching the inner wiring portions of the wiring 82. In particular, the solid patterns 85, which are wide and stiffer than the double-sided wiring substrate 84, are less easily deformed due to stress. This reduces warping of the unsealed region of the IC card when the IC card is used, and further reduces damage to the wiring 82.

Moreover, the solid patterns 85 may be made of metal to be used as wiring for power supply or grounding. This stabilizes the voltage from the power supply.

Embodiment 5

An IC card module of EMBODIMENT 5 of the present invention will be described with reference FIGS. 10 and 11.

Figure 10:
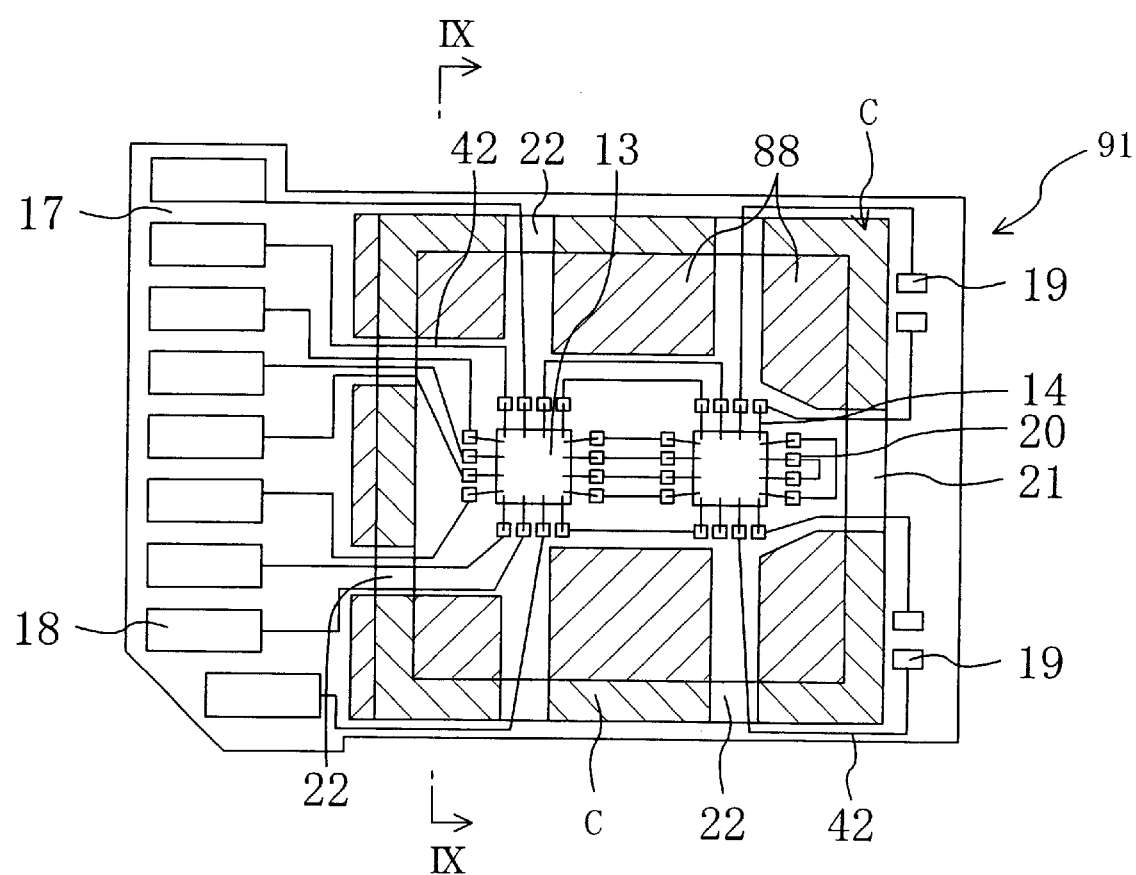
FIG. 10 is a plan view of a printed wiring board used for an IC card module of EMBODIMENT 5 of the present invention.

FIG. 10 is a plan view of a printed wiring board 91 used for the IC card module of this embodiment. FIG. 11 is a partial cross-sectional view illustrating a state during clamping with a sealing mold in the resin sealing process in the fabrication of the IC card module using the printed wiring board 91 of this embodiment. FIG. 11 corresponds to the cross section taken along line IX-IX of the printed wiring board 91 shown in FIG. 10.

In the printed wiring board 91 of this embodiment, a solid pattern 88 is formed on the base 17 in the areas including the resin sealing regions C. The solid pattern 88 has a top surface at a height roughly equal to the height of the top surface of the wiring 42. In this embodiment, the solid pattern 88 is made of a metal plate used for power supply, grounding, or the like. However, the material of the solid pattern 88 is not specified as long as it has a high stiffness.

The following effects are given by providing the mechanically strong solid pattern 88 in the regions C clamped with the sealing mold.

Since the solid pattern 88 is wide and stiff, it is less deformed due to stress. This reduces warping of the regions C clamped with the sealing mold, and thus further reduces damage to the wiring 42 and the base 17.

Figure 11:
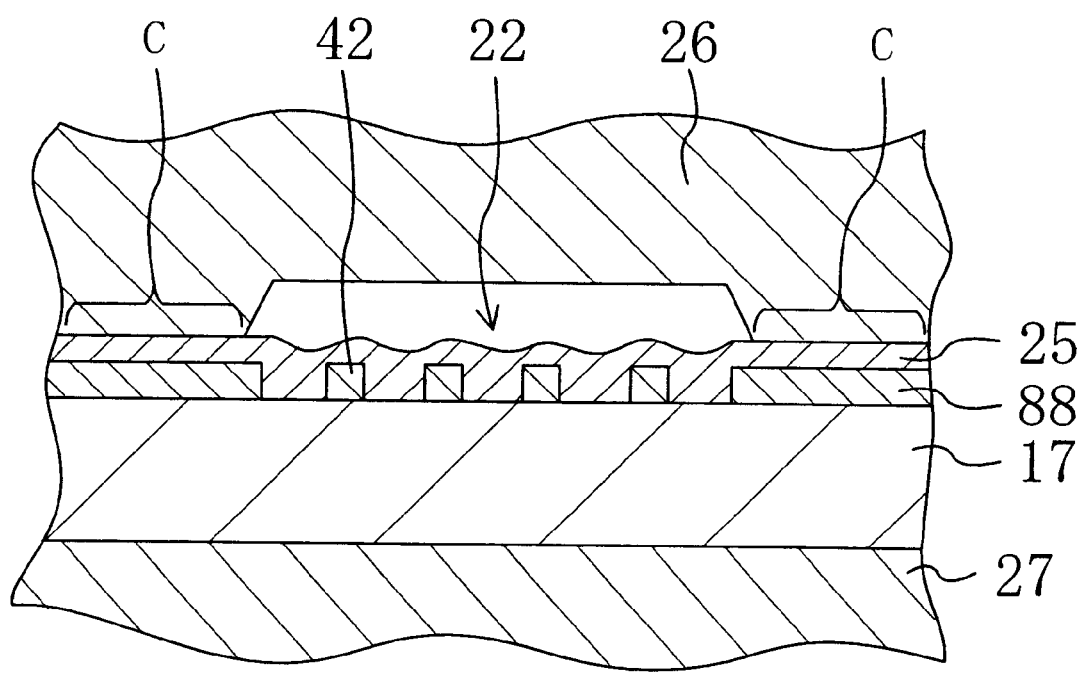
FIG. 11 is a partial cross-sectional view illustrating a state during clamping with a sealing mold in a resin sealing process in the fabrication of the IC card module of EMBODIMENT 5.
Figure 12A:
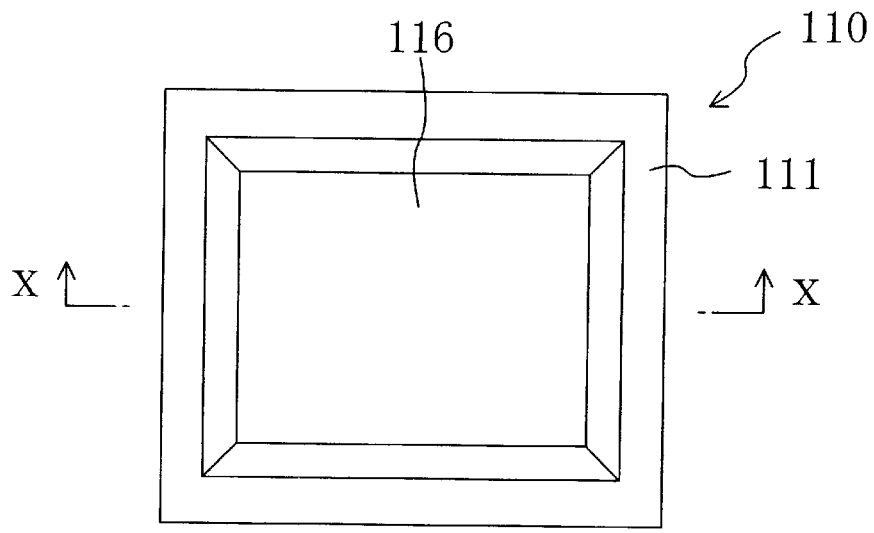
FIG. 12(a) is a top view of a conventional IC card module.
Figure 12B:
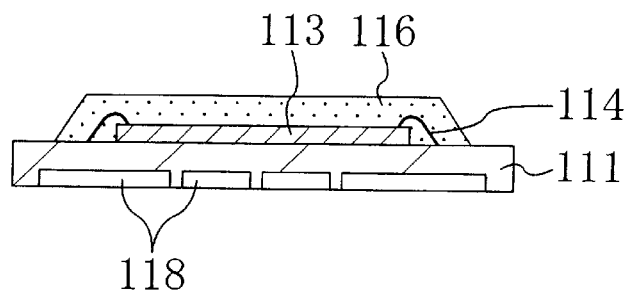
FIG. 12(b) is a cross-sectional view taken along line X-X in FIG. 12(a).

In addition, since the solid pattern 88 has a top surface at a height roughly equal to the height of the top surface of the wiring 42 in the regions C clamped with the sealing mold, the wiring 42 is reliably prevented from being clamped, as shown in FIG. 11. The top surface of the solid pattern may be higher than the top surface of the wiring 42.

The illustrated example of FIG. 11 has the solder resist 25 formed on the printed wiring board 41. It would be understood that damage to the wiring 42 can also be prevented in the case of omitting the solder resist 25.

In this embodiment, the wiring 42 is arranged not to cross the regions C to be clamped with the sealing mold, as shown in FIG. 10. Substantially the same effects will be obtained even when the wiring is arranged to cross the regions C as long as the solid pattern is formed. In other words, the wiring 42 is prevented from being clamped by providing the solid pattern having a top surface at a height roughly equal to the height of the top surface of the wiring 42 in the entire regions C excluding the portions thereof where the wiring 42 is formed.

Moreover, the solid patterns 88 may be made of metal to be used as wiring for power supply or grounding. This stabilizes the voltage from the power supply, and therefore significant effects are provided. The construction of this embodiment can also be applied to the case of providing inner wiring as in EMBODIMENT 4.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. An IC card module comprising:
 a base having a resin sealing region, clamped regions in a periphery zone of the resin sealing region clamped with a sealing mold, and non-clamped regions in the periphery zone of the resin sealing region that are not clamped;
 a semiconductor device mounted on a top surface of the base;
 terminals for external connection formed on the top surface of the base;
 wiring formed on the top surface of the base for connecting the semiconductor device and the terminals; and
 a resin for sealing the semiconductor device,
 wherein the terminals are formed in a region other than any of the resin sealing region, the clamped regions, and the non-clamped regions.

2. The IC card module of claim 1, wherein the wiring is formed along routes passing through the non-clamped regions on the top surface of the base.

3. The IC card module of claim 2, wherein the non-clamped regions on the top surface of the base correspond to a resin injection gate and an air vent of the sealing mold.

4. The IC card module of claim 1, wherein at least one layer of inner wiring and then an insulating layer are formed on the top surface of the base,
 the semiconductor device is formed on the insulating layer, and
 portions of the wiring located in the periphery zone constitute inner wiring.

5. The IC card module of claim 1, wherein a solid pattern is formed on portions of the periphery zone that do not have the wiring.

6. The IC card module of claim 5, wherein a top surface of the solid pattern is at a height equal to or greater than the height of a top surface of the wiring.

7. The IC card module of claim 6, wherein the solid pattern functions as power source wiring or grounding wiring.

8. The IC card module of claim 1, further comprising a semiconductor device formed on a back surface of the base, wiring for connecting the semiconductor device formed on the back surface and the terminals, and a resin for sealing the semiconductor device formed on the back surface.

9. A printed wiring board comprising:
 a base having a resin sealing region, clamped regions in a periphery zone of the resin sealing region clamped with a sealing mold, and non-clamped regions of the periphery zone of the resin sealing region that are not clamped;
 connection lands formed on the top surface of the base for connection with a semiconductor device;
 terminals for external connection formed on the top surface of the base; and
 wiring formed on the top surface of the base for connecting the connection lands and the terminals; and
 wherein the terminals are formed in a region other than any of the resin sealing region, the clamped regions, and the non-clamped regions, and
 the wiring is formed along routes passing through the non-clamped regions on the top surface of the base.

10. The printed wiring board of claim 9, wherein the non-clamped regions on the top surface of the base correspond to a resin injection gate and an air vent of the sealing mold.

11. The printed wiring board of claim 9, wherein a solid pattern is formed on portions of the periphery zone that do not have the wiring.

12. The printed wiring board of claim 11, wherein a top surface of the solid pattern is at a height equal to or greater than the height of a top surface of the wiring.

13. The printed wiring board of claim 9, wherein at least one layer of inner wiring and then an insulating layer are formed on the top surface of the base,
 the semiconductor device is formed on the insulating layer, and portions of the wiring located in the periphery zone constitute the inner wiring.

14. A method for fabricating an IC card module, comprising the steps of:

(a) preparing a printed wiring board comprising: a base having a resin sealing region, clamped regions in a periphery zone of the resin sealing region clamped with a sealing mold, and non-clamped regions in the periphery zone of the resin sealing region that are not clamped; connection lands formed on the top surface of the base for connection with a semiconductor device; terminals for external connection formed on the top surface of the base; and wiring formed on the top surface of the base for connecting the connection lands and the terminals, wherein the terminals are formed in a region other than any of the resin sealing region, the clamped regions, and the non-clamped regions, and the wiring is formed along routes passing through the non-clamped regions on the top surface of the base;

(b) mounting the semiconductor device in the resin sealing region by securing the semiconductor device to the base;

(c) connecting the semiconductor device and the connection lands by means of conductive members; and (d) clamping the printed wiring board with a sealing mold to seal the semiconductor device with a resin.

15. The method of claim 14, wherein in the step (a) of preparing a printed wiring board, the non-clamped regions on the top surface of the base correspond to a resin injection gate and an air vent of the sealing mold.

* * * * *